(12) United States Patent
van Hoff et al.

(10) Patent No.: US 7,715,782 B2
(45) Date of Patent: May 11, 2010

(54) CHANNEL MAPPING FOR MOBILE MEDIA CONTENT TRANSMISSION

(75) Inventors: Arthur Anthonie van Hoff, Menlo Park, CA (US); Mark Andrew Ross, San Carlos, CA (US)

(73) Assignee: Dell Products L.P., Round Rock, TX (US)

( * ) Notice: Subject to any disclaimer, the term of this patent is extended or adjusted under 35 U.S.C. 154(b) by 948 days.

(21) Appl. No.: 11/177,823

(22) Filed: Jul. 8, 2005

(65) Prior Publication Data

US 2007/0010222 A1    Jan. 11, 2007

(51) Int. Cl.
*H04H 20/74* (2008.01)
*H04B 7/00* (2006.01)

(52) U.S. Cl. ............ 455/3.02; 455/154.1; 455/161.1

(58) Field of Classification Search ........... 455/3.02, 455/422.1, 41.2, 7, 12.1, 11.1, 73, 42, 161.1, 455/277.1, 3.01, 422.2, 151.1, 154.1
See application file for complete search history.

(56) References Cited

U.S. PATENT DOCUMENTS

| | | | |
|---|---|---|---|
| 5,949,492 A | | 9/1999 | Mankovitz |
| 5,970,390 A | * | 10/1999 | Koga et al. .............. 455/42 |
| 6,349,329 B1 | | 2/2002 | Mackintosh et al. |
| 6,493,546 B2 | * | 12/2002 | Patsiokas ............ 455/277.1 |
| 6,628,928 B1 | | 9/2003 | Crosby et al. |
| 6,697,631 B1 | * | 2/2004 | Okamoto ............... 455/457 |
| 7,062,238 B2 | * | 6/2006 | Glaza .................. 455/161.1 |
| 2003/0036357 A1 | * | 2/2003 | McGowan ................ 455/62 |
| 2003/0236075 A1 | * | 12/2003 | Johnson et al. ........... 455/99 |
| 2004/0077309 A1 | * | 4/2004 | Brass et al. ................ 455/7 |
| 2005/0215194 A1 | | 9/2005 | Boling et al. |
| 2007/0139878 A1 | * | 6/2007 | Giffin et al. ............ 361/684 |

* cited by examiner

*Primary Examiner*—Sonny Trinh
(74) *Attorney, Agent, or Firm*—Workman Nydegger

(57) ABSTRACT

A channel mapping system has a data source containing data indicative of the geographic range of channels broadcast in at least one selected region and a channel determination module that uses data indicative of a location in conjunction with the data source to determine a preferred channel. The preferred channel may be an FM channel. A transmitter is used with a portable media player to broadcast audio data contained on or received by the portable media player over the preferred channel. The media can be received by a corresponding receiver set to the same preferred channel. Adjustments to the channel settings can be determined repeatedly so that, as a preferred channel changes with location, an automated process or a user facilitated process can be used to change the channel settings on each of the transmitter and the receive. A location identification system such as GPS can be used to identify the location.

24 Claims, 3 Drawing Sheets

CHANNEL MAPPING FOR MOBILE MEDIA CONTENT TRANSMISSION

CROSS-REFERENCE TO RELATED APPLICATIONS

Not applicable.

BACKGROUND OF THE INVENTION

1. The Field of the Invention

The present invention relates generally to the field of audio devices. More particularly, the present invention relates to systems and methods for providing clear media content transmission between a portable media device and a mobile media device such as an automotive radio.

2. The Relevant Technology

Numerous forms of portable media devices are proliferating today. For example, satellite radio, or Digital Audio Radio Service (DARS), is the broadcast of digital audio programming via satellites directly to subscribers or users. Through satellite radio, subscribers can receive high quality, uninterrupted, digital data such as radio over more than one hundred radio channels, for example digital quality music, talk radio, sports, news, weather, and the like. Often, a user of satellite radio has a small portable device that is used to receive the digital data stream. Other examples of portable media players are portable digital audio devices, often referred to as MP3 players, portable CD players, portable DVD players, notebook computers, and the like.

Regardless of the type of portable media device, it is often desirable to transmit the data to an automotive media player, such as a car stereo, so the automobile's media devices can be used to play the selected media. For example, a user may wish to use a portable satellite radio to play satellite radio over the car's stereo system. Similarly, a user may wish to play music from an MP3 player, or the audio from a movie played on a portable DVD player, on the car's stereo systems.

One increasingly common method for transmitting selected media content from a portable device to a car's media player is an FM transmitter. An FM transmitter is itself typically a small portable device that plugs into the headphone jack of a portable media device. The FM transmitter receives the selected media content from the portable device and broadcasts it over a selected FM channel. FM transmitters typically allow a user to broadcast the signal over one of several FM channels that can be manually selected. The car radio, in turn, is set to the matching FM channel so, in effect, the data on the portable media device is received by the car stereo on FM radio.

Perhaps the largest barrier to the widespread popularity of FM transmitters is sound quality. In fact, many users who purchase an FM transmitter often stop using them because of sound quality issues. This is in part because, even when FM channels are successfully matched between the FM transmitter and the car stereo, transmitted sound can be static prone. This effect is greatly accentuated by the presence of overlapping FM broadcast from local news or radio stations. Thus, in major metropolitan areas, it is a user-intensive effort to locate a usable FM channel that does not overlap with local FM stations, thereby minimizing the static and allowing a user to have a positive listening experience.

In addition, a user traveling within or between metropolitan areas may experience an added challenge in the form of changing FM stations. In other words, although a certain FM frequency may be clear in, for example, a region of San Jose, Calif., that FM frequency may not be clear in neighboring San Francisco, Oakland, or even other regions of San Jose. Thus, users traveling by automobile in the San Francisco Bay Area may find the use of FM transmitters difficult or unpleasant as they are required to frequently locate different clear FM channels as they travel from region to region and have to constantly change settings on both the FM transmitter and the car radio.

The foregoing challenges to the use of FM transmitters can also apply to other forms of wireless communications. Accordingly, improved systems, devices, and methods are needed for simplifying the use of transmitters and increasing the quality of a user's media experience.

BRIEF SUMMARY OF THE INVENTION

The present invention overcomes the above challenges of conventional local transmitters by integrating mapping of channel broadcast regions with a transmitter and optionally a location identifier. In a preferred example, the devices and systems of the present invention provide for improved transmission quality between an FM transmitter and a car stereo by identifying clear FM channels based on a user's location and dynamically adjusting the transmission (and also reception) frequency as necessary.

Accordingly, a first example embodiment of the invention is a preferred channel determination system. The preferred channel determination system generally includes: a data source containing data indicative of the geographic range of channels broadcast in at least one selected region; and a channel determination module in communication with the data source. The channel determination module is operable to use the data indicative of the geographic range of channels broadcast in at least one selected region to determine a preferred channel for a given location. Such a system can be a device having a transmitter in communication with the channel determination module, the transmitter operable to broadcast media received from a portable media player over a selected channel. The system can also include a location identification system such as GPS operable to identify the location of the transmitter. The channel determination system can preferably be part of a stand alone transmitter, a media device (such as a digital audio player or satellite radio) having an integrated transmitter, or a media device (such a car stereo) having an integrated receiver.

Another example embodiment of the invention is a method for facilitating the transmission of media between a transmitter and an automotive media player. The method generally includes: providing a portable media player and a transmitter in communication with or integrated with the portable media player. The portable media player has or is operable to receive selected media content. The transmitter is operable to broadcast media received from the portable media player over a range of channels. The method also includes: at a determination module, upon receiving data indicative of the location of the transmitter, accessing a database to identify data related to the channel and broadcast range of area stations and thereby determine a preferred channel for use in transmission at the indicated location; and directing the adjustment of the transmitter and a corresponding receiver to the preferred channel. The preferred method can include an act of providing an audible cue to direct a user to change the channel setting of at least one of the transmitter and the receiver as well as an act of providing a visible cue to direct a user to change the channel setting of at least one of the transmitter and the receiver.

Yet another example embodiment of the invention is, in a computer system that is adapted for use in conjunction with a transmitter, a computer program product for determining a preferred channel for use in local transmission. The computer program product includes a computer readable medium carrying computer executable instructions for performing a method. The method generally includes: receiving data indicative of the location of a transmitter; accessing a data source to identify data related to stations in the time varying location of the transmitter; using the data indicative of the location of a transmitter and the data related to stations in the location of the transmitter, determining a preferred channel for use in local transmission; and directing the adjustment of the transmitter and a corresponding receiver to the preferred channel.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to the figures wherein like structures will be provided with like reference designations. It is understood that the drawings are diagrammatic and schematic representations of presently preferred embodiments of the invention, and are not limiting of the present invention nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of the various forms and details of media players, satellite radio, FM transmitters and receivers, DAB transmitters and receivers, and other forms of transmitters and receivers have not been described in particular detail in order to avoid unnecessarily obscuring the present invention.

The invention encompasses various forms of wireless transmissions that use channels for transmission, including, for example, FM (frequency modulation) transmission or DAB (Digital Audio Broadcasting). FM transmission is a predominant form of wireless communications in which the carrier frequency varies in accordance with the signal. Most wireless communications from handheld devices to stereos or car audio systems is currently performed with FM transmitters. DAB, also known as digital radio or high-definition radio, is audio broadcasting in which analog audio is converted into a digital signal and transmitted on an assigned channel in the AM or (more usually) FM frequency range. DAB offers higher quality audio on the FM broadcast band than analog radio transmissions. Accordingly, as used herein the terms "channel" and "radio channel" denote a specific broadcast frequency, including for example both FM and DAB channels, and do not necessarily require any specific modulation.

Figure 1:
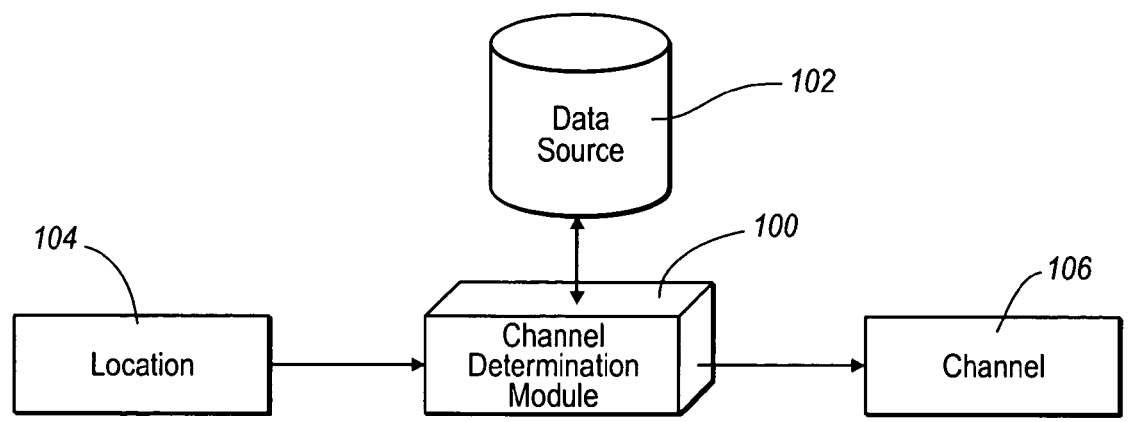
FIG. 1 illustrates a system for determining a preferred channel for use in communicating data between a portable media device and an receiver according to a first example embodiment of the invention.

With reference now to FIG. 1, one embodiment of the invention includes a channel determination module 100 in communication with a data source 102. Upon receiving location data 104 indicative of a transmitter's location, the channel determination module 100 accesses data source 102 obtain data that identifies a radio channel that has previously been identified as clear for that particular location, or that enables the channel determination module to calculate a preferred radio channel. Data 106 indicative of the preferred channel can be output as desired so that a user, or an automated process, can update each of the transmitter and a corresponding receiver to that preferred radio channel. This process can be repeated continuously, if desired, as a user travels in order to continuously identify a preferred clear radio channel that can preferably be used for optimized local radio data transmission.

The data in data source 102 can include, for example, the geographic range and strength of radio signals. Such data can be obtained from third party sources or can be determined by testing. Depending on available memory, such information in data source 102 may be limited to certain regions of the country. A user can obtain data for different regions as necessary, for example by a subscription service that updates the data wirelessly by a satellite radio feed or another method. Alternatively or in addition, the data source 102 can include a simple database which correlates precise location with a preferred radio channel. The determination of preferred channels can be made in advance to speed the task for the channel determination module in operation. In various embodiments, data source 104 can be accessible data that is not integrated with the inventive devices.

Data source 102 can also include route information that a user has entered, preferably with the help of mapping software, that indicates the route or destination a user will follow on a given trip. The route information can be used by the channel determination module 100 to calculate a preferred channel or channels for different portions of the trip. In preferred embodiments the route information can be uploaded from another source, such as a computer having access to mapping software, or input directly by a user. Channel adjustments can be made either with the help of a GPS system or by a user recognizing their location and making the necessary adjustments manually based on the determined preferred channel information. In addition, route information can be combined with geographic channel signal strength data in a channel determination module in advance of a trip so that a channel plan can be provided to a user, for example in a print out or stored digitally on a receiver or transmitter device, so that a user can plan channel changes in advance.

Those skilled in the art will appreciate that the embodiments and features of the channel determination module 100 and the data source 102 may be practiced alone or in network environments with many types of computer system configurations, including media players, satellite radio receivers, FM transmitters or receivers, DAB transmitters or receivers, personal computers, hand-held devices, multi-processor systems, microprocessor-based or programmable consumer electronics, network PCs, minicomputers, mainframe computers, and the like. Aspects of the invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Embodiments of the channel determination module 100 and the data source 102 may include computer-readable media for carrying or having computer-executable instructions or data structures stored thereon. Such computer-readable media can be any available media that can be accessed by a portable device or general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a portable device or general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

Although not required, the invention may be described in the general context of computer-executable instructions, such as program modules, being executed by computers in network environments. Generally, program modules include acts, routines, programs, objects, components, data structures, etc. that perform particular tasks or implement particular abstract data types. Computer-executable instructions, associated data structures, and program modules represent examples of the program code means for executing acts of the methods disclosed herein. The particular sequence of such executable instructions or associated data structures represents examples of corresponding acts for implementing the functions described in such acts.

The devices may also include a magnetic hard disk drive for reading from and writing to a magnetic hard disk, a magnetic disk drive for reading from or writing to a removable magnetic disk, or an optical disk drive for reading from or writing to removable optical disk such as a CD-ROM or other optical media. The drives and their associated computer-readable media provide nonvolatile storage of computer-executable instructions, data structures, program modules and other data. Although the exemplary environment described herein may employ a magnetic hard disk, a removable magnetic disk and/or a removable optical disk, other types of computer readable media for storing data can be used, including magnetic cassettes, flash memory cards, digital versatile disks, Bernoulli cartridges, RAMs, ROMs, and the like.

Program code means comprising one or more program modules may be stored on the hard disk, magnetic disk, optical disk, ROM or RAM, including an operating system, one or more application programs, other program modules, and program data. A user may enter commands and information through a keyboard, pointing device, or other input devices (not shown), such as a microphone, joy stick, touch pad, game pad, satellite dish, scanner, or the like. These and other input devices are often connected to the processing unit through a universal serial bus (USB) or serial port interface coupled to system bus. Alternatively, the input devices may be connected by other interfaces, such as a parallel port, or a game port. A display device is also connected to system bus via an interface, such as video adapter.

Figure 2:
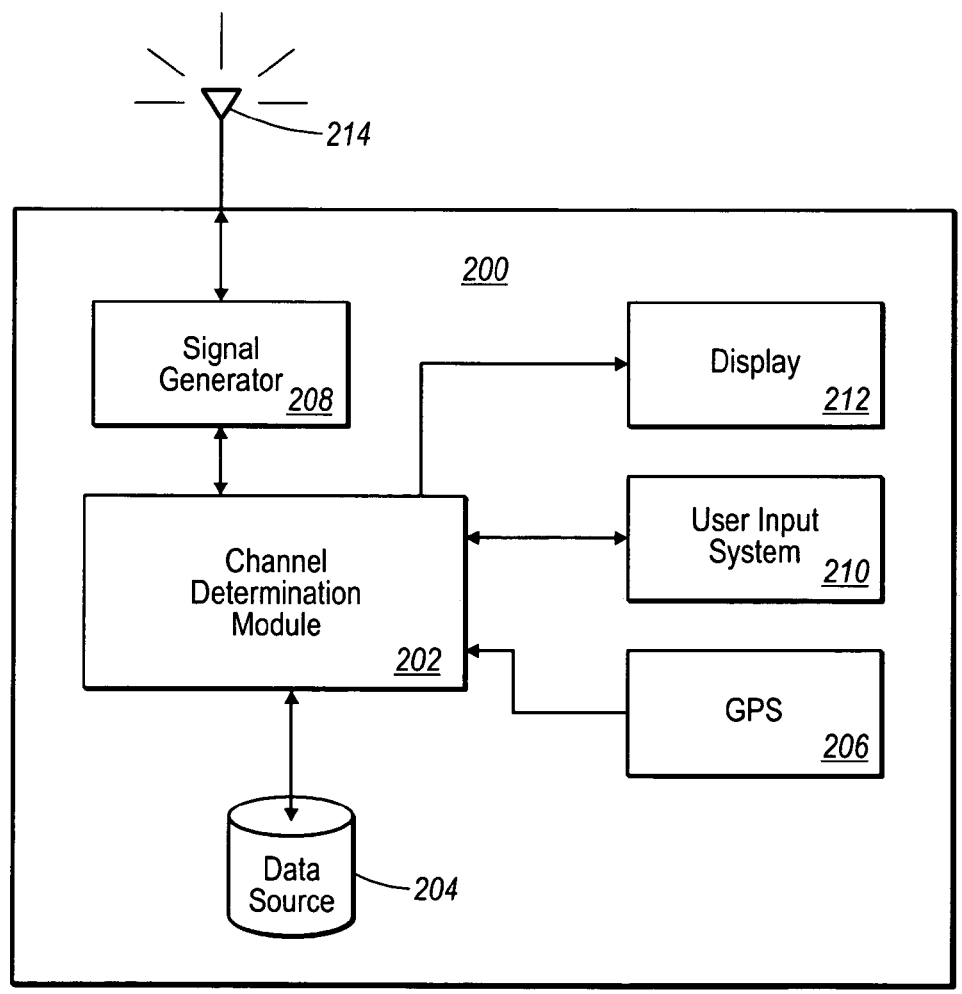
FIG. 2 illustrates a system for determining and adjusting to a preferred channel for use in communicating data between a portable media device, such as a satellite radio receiver, and a receiver according to a second example embodiment of the invention.

Referring now to FIG. 2, a single device can preferably house numerous modules or components used in generating, transmitting, receiving, and playing media between devices connected by a radio signal. By way of example only, such a device may be a portable satellite radio receiver 200. The satellite radio receiver 200 has at least a channel determination module 202 as previously discussed. In addition, the satellite radio receiver 200 can have a data source 204 as previously discussed, a Global Positioning System (GPS) unit 206, a display 212, a signal generating module 208, a user input system 210, and an antenna 214 for receiving satellite radio signals or transmitting signals. While depicted as a single antenna, those skilled in the art will recognize that multiple antennas may be used for each distinct type of radio signal. Other components, such as those necessary to operate a satellite radio device, are not depicted to avoid unnecessarily obscuring the invention. The inclusion of such systems, however, will be apparent to one skilled in the art in view of the disclosure herein.

This portable satellite radio receiver 200 allows a user to quickly and easily communicate data to an automotive or other radio receiver by having the preferred radio channel selected by an automated system. The display 212 indicates to a user the selected preferred radio channel and other selected data, for example satellite radio information or the timing of radio channel changes that may be necessary. The optional user input system 210, for example a physical or digital switch or channel dial, preferably allows a user to input route information or override the determined preferred radio channel in the event that the identified channel has unexpected interference.

An integrated satellite radio receiver can have all or only some of the foregoing. For example, the device could receive location data from a source other than an integrated GPS system. Such a source may include, by way of example only, user input or a feed from a separate device. GPS and other location determining systems are well known in the art and will therefore not be discussed in further detail herein.

As another example, the display can be omitted in the event the device can communicate by audio to a user or wirelessly to the receiver to indicate to the receiver the operable radio channel. The data source 204 can be omitted in the event that the device can actively or passively receive such data from another source.

In addition to or instead of a satellite radio receiver, the device can have a media player device, such as for example a digital audio player such as an MP3 player, a PDA having media capability, or a portable DVD player or other video source having an audio output that is more preferably played by car or other audio system than from its own speakers.

Figure 3:
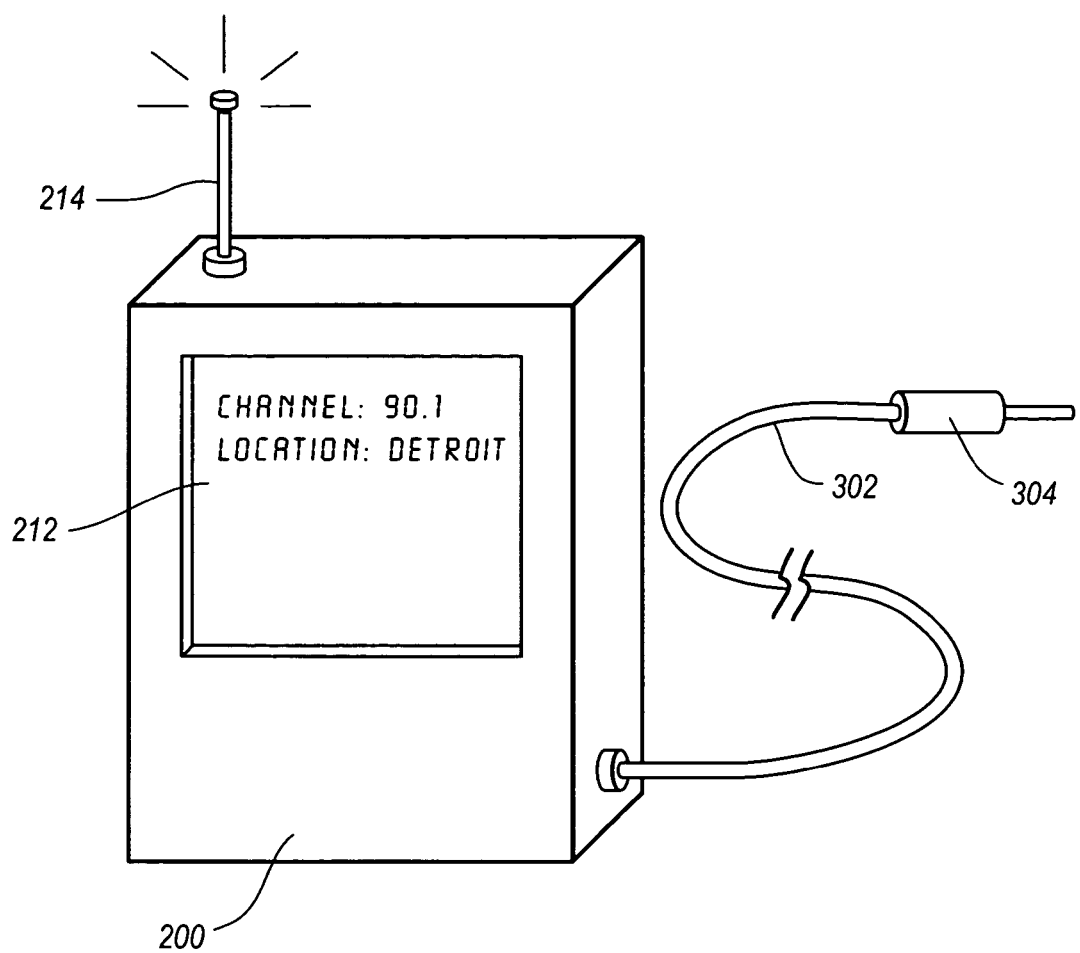
FIG. 3 illustrates a device for determining a preferred channel for use in transmitting data from a portable media device to an receiver according to another example embodiment of the invention.

As illustrated in FIG. 3, another preferred embodiment of the invention includes neither satellite radio systems or media player components. Rather, an enhanced transmitter 300 uses a cable 302 having a plug 304 to connect with a separate satellite radio device or other media player. Such a device may also preferably include many of the components depicted in FIG. 2, including for example a display 212 and an antenna 214. This device is advantageous in that it is widely compatible and can be used with many devices.

Figure 4:
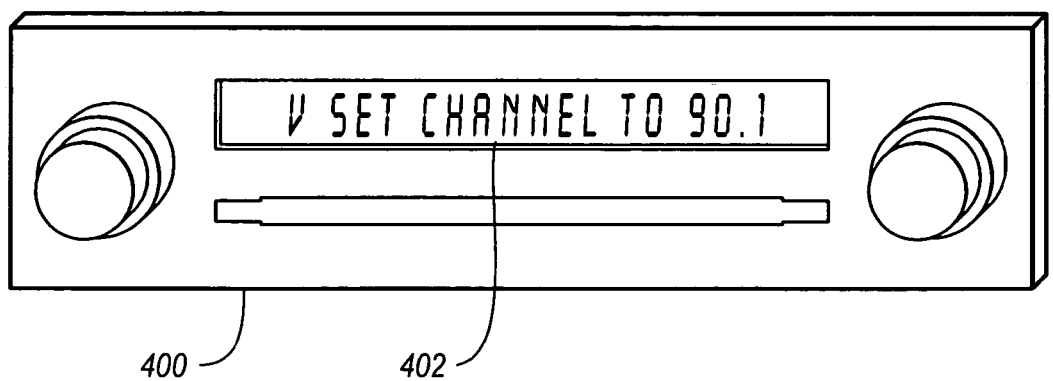
FIG. 4 illustrates a device for determining a preferred channel for use in receiving data from a portable media device via a transmitter according to yet another example embodiment of the invention.

As illustrated in FIG. 4, another embodiment of the invention is an enhanced radio receiver 400, in the depicted example an automotive receiver. This device has the channel determination module as previously discussed. In addition, the radio receiver can have a data source having data indicative of radio channel regions, a Global Positioning System (GPS) unit, a display 402, radio receiver components, a user input system and/or other devices as desired and known in the art. These systems allow a user to identify the preferred radio channel for use with any radio transmitter in the vicinity of the receiver.

A user facilitated adjustment of the channel on the transmitter and/or the receiver can be coordinated by visual or audio cues. For example, a display on the transmitter and/or the receiver can identify the preferred channel so that a user can make the necessary adjustments. In the event that the channel determination module is integrated with the transmitter or the receiver, then it may be necessary that the user adjust only one of them. An audio cue, ranging from a simple beep to a voice recording also can be used to draw a user's attention to the fact that a channel update is required. In addition, the visual or audio communication can be used to determine the precise timing of preferred channel adjustment. This is particularly advantageous in the event that one of the transmitter or the receiver can be automatically adjusted and the user needs to adjust the other device. In addition, a channel transition can be coordinated without user assistance between a receiver and a transmitter by automated systems in the event that each device is appropriately equipped. For example, a wireless system such as Bluetooth can be used to communicate between the devices. Information presented on display 402 can be sent from the transmitter.

Figure 5:
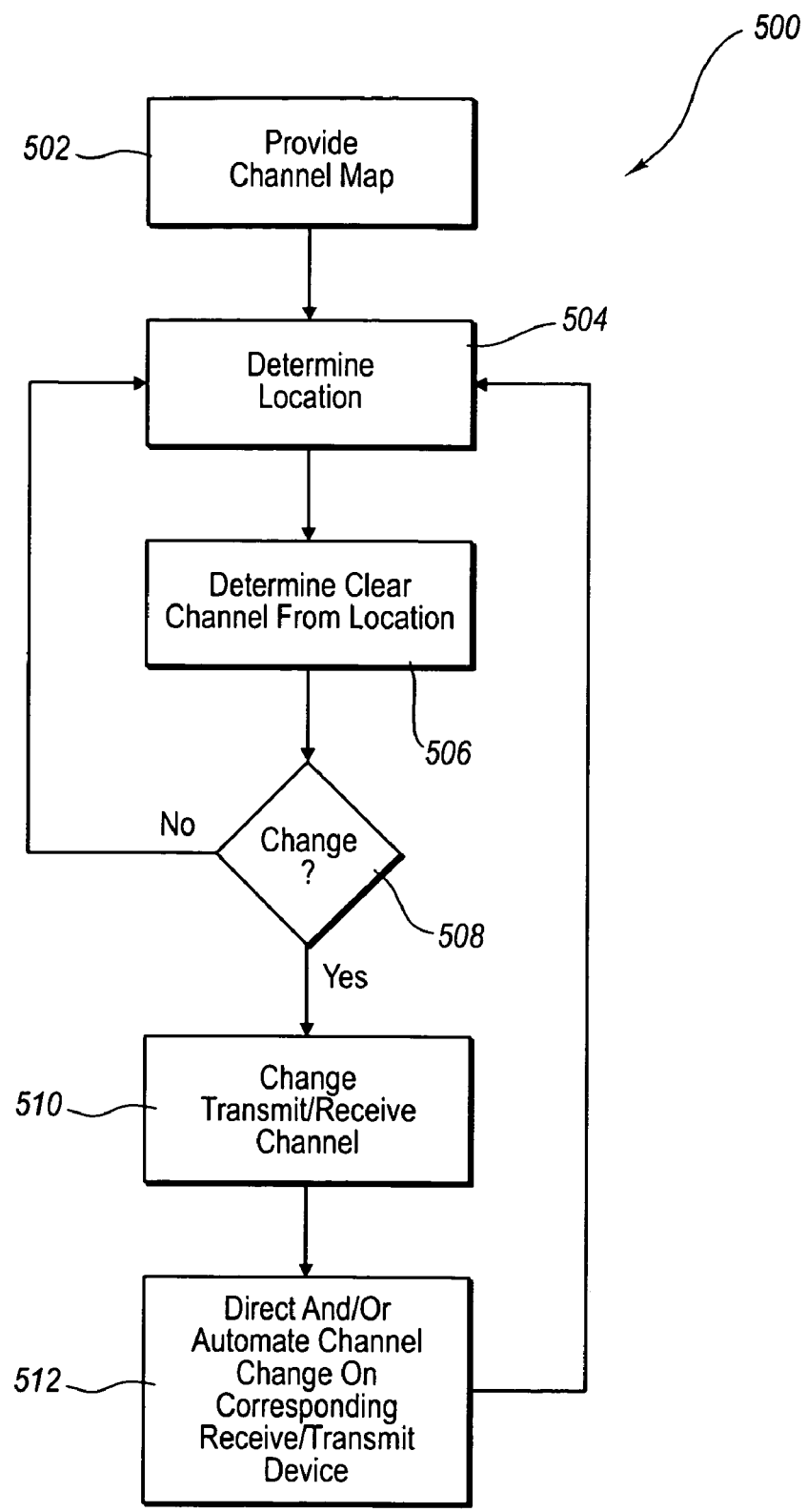
FIG. 5 illustrates, in block form, a preferred method for determining a preferred clear channel for use in communicating data between media devices via a transmitter according to yet another example embodiment of the invention.

FIG. 5 is a flow chart in block form illustrating one preferred method 500 of implementing the invention. In act 502, a channel map is provided. The channel map comes from a data source which is rather preferably a database that indicates the channel, range, and optionally strength of each station broadcasting over a channel, for example an FM channel in a region, or a list of the preferred channels for use in local transmission by a user operated transmitter.

In act 504, the location of the transmitter and/or receiver is provided. By way of example, the location can be provided by integrated GPS hardware, an attached GPS device, wireless input, manual input, or other method. Integrated GPS is preferred to quickly and accurately determine the location, but this is not required. Less precise methods, such as user identified zip codes or estimations made on mapping software, can also be used. The location is nevertheless preferably determined in sufficient detail to correspond to the strength of area broadcast stations such that ideal channel transitions can be determined.

Next, in act 506, module 100 (or 202) is used to determine a preferred clear channel. This is performed as the processor accesses the channel map and, using the provided location, determines the clear channels and selects a preferred channel.

Although a number of eligible clear channels may be identified, the processor will preferably select one that has the highest likelihood of remaining a clear channel for an extended period of time. This can be determined by analyzing adjacent locations to identify clear channels in the adjacent areas. A channel that remains clear in adjacent areas is preferable to one that is only clear in the current area since fewer channel settings changes will be necessary as a user travels from location to location. In a still more preferred embodiment of the invention, an integrated GPS device, for example, can have major thoroughfares or a user's travel plan mapped and this data can be used to identify preferred channels for an extended period. As previously noted, the travel plans can be preferably formed with the help of mapping software or online mapping services. Travel routes and therefore clear channel indications can be performed based on user input travel plans.

In act 508, the channel determination module 100 preferably determines whether a change to the channel settings on the transmitter and/or receiver needs to be made by querying the connected device(s) or by direct knowledge of the current transmit channel. If not, then the system preferably continues to identify the current location in act 504 so timely channel adjustments can be made. If channel adjustments do need to be made, then the processor can either automate a change in the channel settings on the transmitter and/or receiver or direct a user to manually change the channel settings on the transmitter and/or receiver, as necessary, as indicated in act 510.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A preferred channel determination system, comprising:
   a data source containing data indicative of the geographic range of channels broadcast in at least one selected region and route information that indicates a user's expected travel route; and
   a channel determination module in communication with the data source, the channel determination module operable to use the data indicative of the geographic range of channels broadcast in at least one selected region to determine a preferred channel for use in transmission at a given location and configured to use the route information to determine preferred channels for certain portions of a user's trip.

2. A system as defined in claim 1, wherein the channels broadcast in at least one selected region comprise FM channels and the preferred channel for a given location comprises an FM channel.

3. A system as defined in claim 1, wherein the channels broadcast in at least one selected region comprise DAB channels and the preferred channel for a given location comprises and a DAB channel.

4. A system as defined in claim 1, further comprising an FM transmitter in communication with the channel determination module, the FM transmitter operable to broadcast media received from a portable media player over a selected FM channel.

5. A system as defined in claim 4, further comprising means for communicating the selected FM channel to a user.

6. A system as defined in claim 4, further comprising a location identification device operable to identify the location of the FM transmitter.

7. A system as defined in claim 1, further comprising:
an FM receiver in communication with the channel determination module, the FM receiver operable to receive media transmitted over a selected FM channel.

8. A system as defined in claim 7, further comprising means for communicating the selected FM channel to a user.

9. A system as defined in claim 7, further comprising a location identification device operable to identify the location of the FM receiver.

10. A system as defined in claim 1, further comprising a satellite radio player and an FM transmitter integrated in a single device with the channel determination module.

11. A system as defined in claim 1, further comprising an FM transmitter and a device selected from a car stereo and a digital audio player integrated in a single device with the channel determination module.

12. A system as defined in claim 1, further comprising a video player, configured to output the audio portion of selected video content such that it can be played by a different device, integrated in a single device with the channel determination module and a radio transmitter.

13. A system as defined in claim 1, further comprising a module for providing an audible cue to direct a user to change a channel setting on at least one of a transmitter and a receiver in response to correspond to the preferred channel.

14. A system as defined in claim 1, further comprising a module for providing a visible cue to direct a user to change the channel setting of at least one of a transmitter and a receiver.

15. A method for facilitating the transmission of media between an FM transmitter and an automotive radio, comprising:
providing a portable media player, the portable media player having or being operable to receive selected media content;
providing a transmitter in communication with or integrated with the portable media player, the transmitter operable to broadcast media received from the portable media player over a range of channels;
at a channel determination module, upon receiving data indicative of the location of the transmitter and route information indicative of a user's expected travel route, accessing a database to identify data related to the channel and broadcast range of area stations and using the route information to thereby determine a preferred channel for use in transmission at the indicated location and for certain portions of a user's trip; and
directing the adjustment of the transmitter and a corresponding receiver to the preferred channel.

16. A method as defined in claim 15, wherein the preferred channel comprises an FM channel and the transmitter and corresponding receiver are an FM transmitter and an FM receiver.

17. A method as defined in claim 15, wherein the data indicative of the location of the transmitter is determined by a GPS device.

18. A method as defined in claim 17, wherein the transmitter, the channel determination module, and the GPS device are integrated in a single device.

19. A method as defined in claim 15, wherein the portable media player comprises a satellite radio player.

20. A method as defined in claim 15, wherein the portable media player is a digital audio player.

21. A method as defined in claim 15, wherein the portable media player is a video player and the transmitter is configured to broadcast the audio portion of selected video content.

22. A method as defined in claim 15, further comprising the act of providing an audible cue to direct a user to change the channel setting of at least one of the transmitter and the receiver.

23. A method as defined in claim 15, further comprising the act of providing a visible cue to direct a user to change the channel setting of at least one of the transmitter and the receiver.

24. In a computer system that is adapted for use in conjunction with a transmitter, a computer readable medium encoded with computer executable instructions for performing a method for determining a preferred channel for use in local transmission, the method comprising:
receiving data indicative of the actual location of a transmitter;
accessing a data source to identify data related to stations which broadcast in the actual location of the transmitter and locations adjacent to the actual location of the transmitter;
using the data indicative of the actual location of a transmitter and the data related to stations which broadcast in the actual location of the transmitter and locations adjacent to the actual location of the transmitter, determining a preferred channel for use in local transmission by selecting a channel that is clear in both the actual location of the transmitter and locations adjacent to the actual location of the transmitter; and
directing the adjustment of the transmitter and a corresponding receiver to the preferred channel.

* * * * *